US011005466B2

(12) United States Patent
Ashtiani et al.

(10) Patent No.: US 11,005,466 B2
(45) Date of Patent: May 11, 2021

(54) MEASUREMENT AND CORRECTION OF MULTIPHASE CLOCK DUTY CYCLE AND SKEW

(71) Applicant: Kandou Labs SA, Lausanne (CH)

(72) Inventors: Milad Ataei Ashtiani, Saint-Suplice (CH); Kiarash Gharibdoust, Lonay (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/854,681

(22) Filed: Apr. 21, 2020

(65) Prior Publication Data

US 2020/0321950 A1 Oct. 8, 2020

Related U.S. Application Data

(63) Continuation of application No. 16/378,476, filed on Apr. 8, 2019, now Pat. No. 10,630,272.

(51) Int. Cl.
*H03K 3/017* (2006.01)
*H03K 5/04* (2006.01)
*H03K 7/08* (2006.01)
*H03K 5/156* (2006.01)
*H03K 5/133* (2014.01)

(52) U.S. Cl.
CPC .......... *H03K 5/1565* (2013.01); *H03K 5/133* (2013.01)

(58) Field of Classification Search
CPC ........ H03K 5/1565; H03K 7/08; H03K 3/017; H03K 5/151; H03L 7/0812
USPC ........................................ 327/175, 158, 161
See application file for complete search history.

(56) References Cited

U.S. PATENT DOCUMENTS

| 4,839,907 A | 6/1989 | Saneski |
| 5,266,907 A | 11/1993 | Dacus |
| 5,528,198 A | 6/1996 | Baba et al. |
| 5,602,884 A | 2/1997 | Vvieczorkiewicz et al. |

(Continued)

FOREIGN PATENT DOCUMENTS

| CN | 203675093 U | 6/2014 |
| EP | 0740423 A2 | 10/1996 |

OTHER PUBLICATIONS

Loh, Mattew, et al., "A 3×9 Gb/s Shared, All-Digital CDR for High-Speed, High-Density I/O", IEEE Journal of Solid-State Circuits, vol. 47, No. 3, Mar. 2012, 641-651 (11 pages).

(Continued)

*Primary Examiner* — Quan Tra
(74) *Attorney, Agent, or Firm* — Invention Mine LLC

(57) ABSTRACT

Methods and systems are described for generating, at a plurality of delay stages of a local oscillator, a plurality of phases of a local oscillator signal, generating a loop error signal based on a comparison of one or more phases of the local oscillator signal to one or more phases of a received reference clock, generating a plurality of phase-specific quadrature error signals, each phase-specific quadrature error signal associated with a respective phase of the plurality of phases of the local oscillator signal, each phase-specific quadrature error signal based on a comparison of the respective phase to two or more other phases of the local oscillator signal, and adjusting each delay stage according to a corresponding phase-specific quadrature error signal of the plurality of phase-specific quadrature error signals and the loop error signal.

20 Claims, 11 Drawing Sheets

(56) References Cited

U.S. PATENT DOCUMENTS

| | | |
|---|---|---|
| 5,629,651 A | 5/1997 | Mizuno |
| 5,802,356 A | 9/1998 | Gaskins et al. |
| 6,026,134 A | 2/2000 | Duffy et al. |
| 6,122,336 A | 9/2000 | Anderson |
| 6,307,906 B1 | 10/2001 | Tanji et al. |
| 6,316,987 B1 | 11/2001 | Dally et al. |
| 6,380,783 B1 | 4/2002 | Chao et al. |
| 6,389,091 B1 | 5/2002 | Yamaguchi et al. |
| 6,509,773 B2 | 1/2003 | Buchwald et al. |
| 6,717,478 B1 | 4/2004 | Kim et al. |
| 6,838,951 B1 | 1/2005 | Nieri et al. |
| 7,078,978 B2 | 7/2006 | Wakii |
| 7,102,449 B1 | 9/2006 | Mohan |
| 7,199,728 B2 | 4/2007 | Dally et al. |
| 7,336,112 B1 | 2/2008 | Sha et al. |
| 7,532,697 B1 | 5/2009 | Sidiropoulos et al. |
| 7,535,957 B2 | 5/2009 | Ozawa et al. |
| 7,616,075 B2 | 11/2009 | Kushiyama |
| 7,650,525 B1 | 1/2010 | Chang et al. |
| 7,688,929 B2 | 3/2010 | Co |
| 7,839,229 B2 | 11/2010 | Nakamura et al. |
| 7,860,190 B2 | 12/2010 | Feller |
| 8,036,300 B2 | 10/2011 | Evans et al. |
| 8,253,454 B2 | 8/2012 | Lin |
| 8,791,735 B1 | 7/2014 | Shibasaki |
| 8,929,496 B2 | 1/2015 | Lee et al. |
| 9,036,764 B1 | 5/2015 | Hossain et al. |
| 9,059,816 B1 | 6/2015 | Simpson et al. |
| 9,306,621 B2 | 4/2016 | Zhang et al. |
| 9,374,250 B1 | 6/2016 | Musah et al. |
| 9,397,868 B1 | 7/2016 | Hossain et al. |
| 9,438,409 B1 | 9/2016 | Liao et al. |
| 9,520,883 B2 | 12/2016 | Shibasaki |
| 9,565,036 B2 | 2/2017 | Zerbe et al. |
| 9,577,815 B1 | 2/2017 | Simpson et al. |
| 9,602,111 B1 | 3/2017 | Shen et al. |
| 9,906,358 B1 | 2/2018 | Tajalli |
| 9,960,902 B1 | 5/2018 | Lin et al. |
| 10,055,372 B2 | 8/2018 | Shokrollahi |
| 2003/0001557 A1 | 1/2003 | Pisipaty |
| 2003/0146783 A1 | 8/2003 | Bandy et al. |
| 2004/0092240 A1 | 5/2004 | Hayashi |
| 2005/0024117 A1 | 2/2005 | Kubo et al. |
| 2005/0084050 A1 | 4/2005 | Cheung et al. |
| 2005/0117404 A1 | 6/2005 | Savoj |
| 2005/0128018 A1 | 6/2005 | Meltzer |
| 2005/0201491 A1 | 9/2005 | Wei |
| 2005/0220182 A1 | 10/2005 | Kuwata |
| 2005/0275470 A1 | 12/2005 | Choi |
| 2006/0062058 A1 | 3/2006 | Lin |
| 2006/0140324 A1 | 6/2006 | Casper et al. |
| 2006/0232461 A1 | 10/2006 | Felder |
| 2007/0001713 A1 | 1/2007 | Lin |
| 2007/0001723 A1 | 1/2007 | Lin |
| 2007/0047689 A1 | 3/2007 | Menolfi et al. |
| 2007/0086267 A1* | 4/2007 | Kwak .................. H03K 5/1565 365/233.1 |
| 2007/0146088 A1 | 6/2007 | Arai et al. |
| 2007/0147559 A1 | 6/2007 | Lapointe |
| 2007/0183552 A1 | 8/2007 | Sanders et al. |
| 2007/0201597 A1 | 8/2007 | He et al. |
| 2008/0007367 A1 | 1/2008 | Kim |
| 2008/0111634 A1 | 5/2008 | Min |
| 2008/0165841 A1 | 7/2008 | Wall et al. |
| 2008/0181289 A1 | 7/2008 | Moll |
| 2008/0317188 A1 | 12/2008 | Staszewski et al. |
| 2009/0103675 A1 | 4/2009 | Yousefi et al. |
| 2009/0167389 A1 | 7/2009 | Reis |
| 2009/0195281 A1 | 8/2009 | Tamura et al. |
| 2009/0231006 A1 | 9/2009 | Jang et al. |
| 2009/0262876 A1 | 10/2009 | Arima et al. |
| 2009/0262877 A1 | 10/2009 | Shi et al. |
| 2010/0033259 A1 | 2/2010 | Miyashita |
| 2010/0090723 A1 | 4/2010 | Nedovic et al. |
| 2010/0090735 A1* | 4/2010 | Cho .................. H03L 7/0814 327/158 |
| 2010/0156543 A1 | 6/2010 | Dubey |
| 2010/0180143 A1 | 7/2010 | Ware et al. |
| 2010/0220828 A1 | 9/2010 | Fuller et al. |
| 2011/0002181 A1 | 1/2011 | Wang et al. |
| 2011/0025392 A1 | 2/2011 | Wu et al. |
| 2011/0311008 A1 | 12/2011 | Slezak et al. |
| 2012/0200364 A1 | 8/2012 | Iizuka et al. |
| 2012/0206177 A1 | 8/2012 | Colinet et al. |
| 2012/0235717 A1 | 9/2012 | Hirai et al. |
| 2012/0327993 A1 | 12/2012 | Palmer |
| 2013/0088274 A1 | 4/2013 | Gu |
| 2013/0091392 A1 | 4/2013 | Valliappan et al. |
| 2013/0093471 A1 | 4/2013 | Cho et al. |
| 2013/0107997 A1 | 5/2013 | Chen |
| 2013/0108001 A1 | 5/2013 | Chang et al. |
| 2013/0207706 A1 | 8/2013 | Yanagisawa |
| 2013/0243127 A1 | 9/2013 | Ito et al. |
| 2013/0271194 A1 | 10/2013 | Madoglio et al. |
| 2013/0285720 A1 | 10/2013 | Jibry |
| 2013/0314142 A1 | 11/2013 | Tamura et al. |
| 2014/0286381 A1 | 9/2014 | Shibasaki |
| 2015/0078495 A1 | 3/2015 | Hossain et al. |
| 2015/0117579 A1 | 4/2015 | Shibasaki |
| 2015/0180642 A1 | 6/2015 | Hsieh et al. |
| 2015/0220472 A1 | 8/2015 | Sengoku |
| 2015/0256326 A1 | 9/2015 | Simpson et al. |
| 2016/0056980 A1 | 2/2016 | Wang et al. |
| 2016/0134267 A1 | 5/2016 | Adachi |
| 2017/0228215 A1 | 8/2017 | Chatwin et al. |
| 2017/0310456 A1 | 10/2017 | Tajalli |
| 2018/0083763 A1 | 3/2018 | Black et al. |
| 2018/0115410 A1 | 4/2018 | Tajalli et al. |
| 2018/0375693 A1 | 12/2018 | Zhou et al. |

OTHER PUBLICATIONS

Riley, M. W., et al., "Cell Broadband Engine Processor: Design and Implementation", IBM Journal of Research and Development, vol. 51, No. 5, Sep. 2007, 545-557 (13 pages).

International Search Report and Written Opinion for PCT/US2020/027272, dated Jul. 23, 2020, 1-11 (11 pages).

Ha, J.C., et al., "Unified All-Digital Duty-Cycle and phase correction circuit for QDR I/O interface", Electronic Letters, The Institution of Engineering and Technology, vol. 44, No. 22, Oct., 23, 2008, 1300-1301 (2 pages).

Ryu, Kyungho, et al., "Process-Variation-Calibrated Multiphase Delay Locked Loop With a Loop-Enbedded Duty Cycle Corrector", IEEE Transactions on Circuits and Systems, vol. 61, No. 1, Jan. 2014, 1-5 (5 pages).

Wang, Yi-Ming, et al., "Range Unlimited Delay-Interleaving and -Recycling Clock Skew Compensation and Duty-Cycle Correction Circuit", IEEE Transactions on Very Large Scale Integration (VLSI) Systems, vol. 23, No. 5, May 2015, 856-868 (13 pages).

Chang, Hong-Yeh, et al., "A Low-Jitter Low-Phase-Noise 10-GHz Sub-Harmonically Injection-Locked PLL With Self-Aligned DLL in 65-nm CMOS Technology", IEEE Transactions on Microwave Theory and Techniques, vol. 62, No. 3, Mar. 2014, 543-555 (13 pages).

Nandwana, Romesh Kumar, et al., "A Calibration-Free Fractional-N Ring PLL Using Hybrid Phase/Current-Mode Phase Interpolation Method", IEEE Journal of Solid-State Circuits, vol. 50, No. 4, Apr. 2015, 882-895 (14 pages).

Ng, Herman Jalli, et al., "Low Phase Noise 77-GHz Fractional-N PLL with DLL-based Reference Frequency Multiplier for FMCW Radars", European Microwave Integrated Circuits Conference, Oct. 10-11, 2011, 196-199 (4 pages).

Tajalli, Armin, "Wideband PLL Using Matrix Phase Comparator", Journal of Latex Class Files, vol. 14, No. 8, Aug. 2016, 1-8 (8 pages).

(56) References Cited

OTHER PUBLICATIONS

Tan, Han-Yuan, "Design of Noise-Robust Clock and Data Recovery Using an Adaptive-Bandwidth Mixed PLL/DLL", Harvard University Thesis, Nov. 2006, 1-169 (169 pages).

* cited by examiner

MEASUREMENT AND CORRECTION OF MULTIPHASE CLOCK DUTY CYCLE AND SKEW

CROSS-REFERENCE TO RELATED APPLICATIONS

This application is a continuation of U.S. application Ser. No. 16/378,476, filed Apr. 8, 2019, naming Milad Ataei Ashtiani, entitled "Measurement and Correction of Multiphase Clock Duty Cycle and Skew", which is hereby incorporated by reference in its entirety for all purposes.

REFERENCES

The following prior applications are herein incorporated by reference in their entirety for all purposes:

U.S. Patent Publication 2018/0115410A1 of application Ser. No. 15/791,373, filed Oct. 23, 2017, naming Armin Tajalli and Amin Shokrollahi, entitled "Quadrature and Duty Cycle Correction in Matrix Phase Lock Loop", hereinafter referred to as [Tajalli I].

FIELD OF THE INVENTION

The present invention relates to communications systems circuits generally, and more particularly to obtaining stable, correctly phased receiver clock signals from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. This Clock and Data Recovery (CDR) not only must determine the appropriate sample timing, but must continue to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling. In advanced embodiments, multiple local clocks with particular phase relationships may be generated, as one example to permit overlapping or parallel processing of received information by multiple instances of the receiver embodiment.

BRIEF DESCRIPTION

Data receivers require accurately adjusted local clocks to enable accurate signal detection, and advanced receiver designs may require generation of multiple clock phases, collectively having particular relationships with the received data signals, and fixed phase relationships among each other. A common receiver clock subsystem utilizes a phase-locked loop (PLL) to produce a local clock having the desired frequency and phase relationship with a reference signal, generally obtained with or derived from the received data. Within the PLL, a voltage-controlled oscillator based on a ring-connected sequence of active elements conveniently produces multiple clock phases in a fixed relationship. However, variations among the ring's active elements can also induce periodic clock variations and thus result in undesirable duty cycle variations as well as skew between output clock phases.

A configurable clock buffer chain is described, allowing adjustment of clock duty cycle and overall delay by internally modifying the rise and fall time of signals propagating between buffer stages. These buffers are combined with a measurement subsystem capable of directly measuring clock duty cycle and inter-phase skew, to provide clean, accurately timed multiphase clock signals to the data receiver.

DETAILED DESCRIPTION

Figure 1:
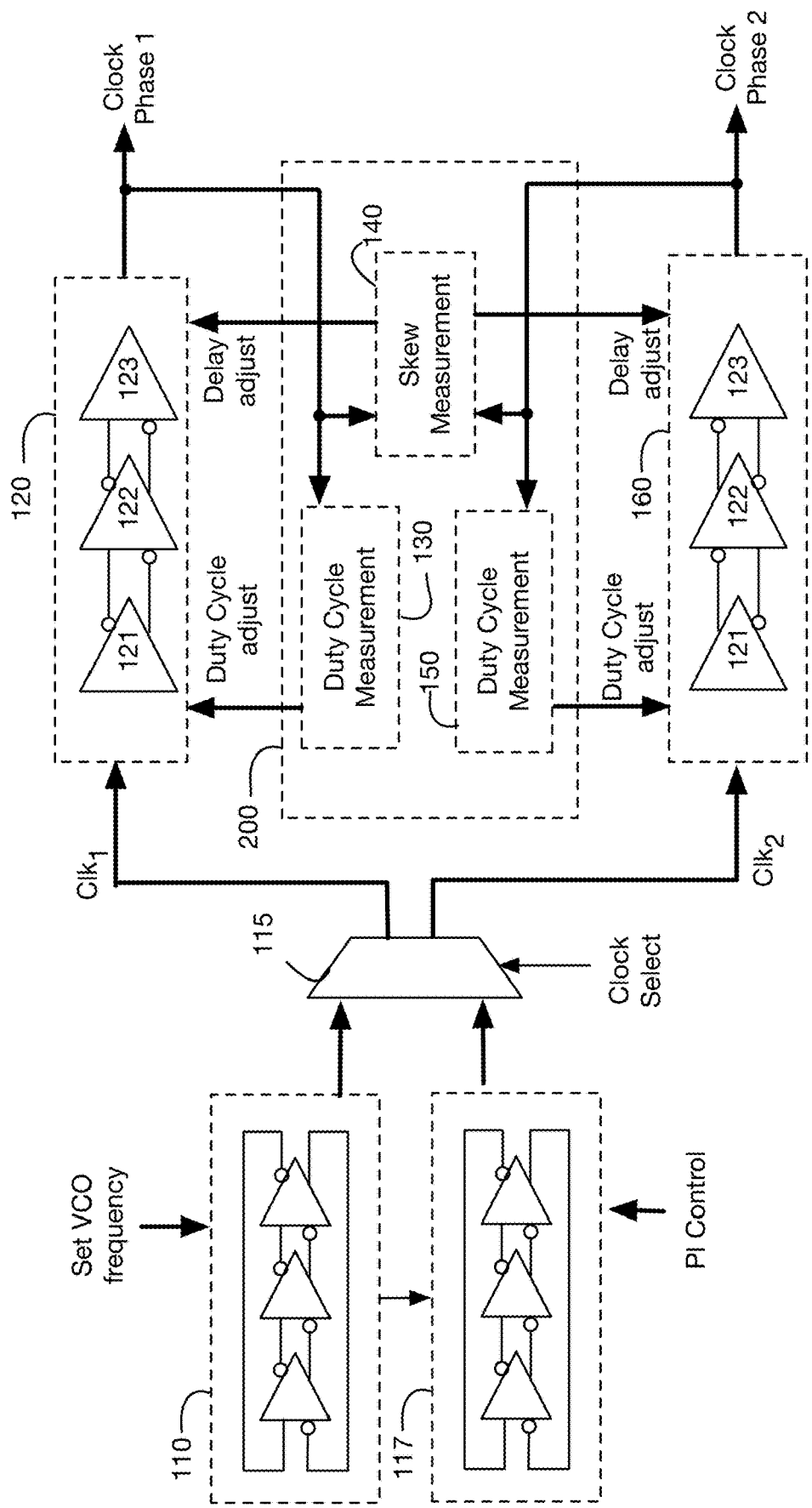
FIG. 1 is a block diagram of one clock generator embodiment, producing multiple output clocks in a desired relationship.

To reliably detect the data values transmitted over a communications system, a receiver must accurately measure the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream. In general, the receiver embodiments of such timing methods are described as Clock-Data Recovery (CDR) or alternatively as performing Clock-Data Alignment (CDA). These timing methods are often based on Phase-Lock Loop (PLL) or Delay-Locked Loop (DLL) synthesis of a local receive clock having the desired frequency and phase characteristics.

In both PLL and DLL embodiments, a Phase Detector compares the relative phase (and in some variations, the relative frequency) of a received reference signal and a local clock signal to produce an error signal, which is subsequently used to correct the phase and/or frequency of the local clock source and thus minimize the error. As this feedback loop behavior will lead to a given PLL embodiment producing a fixed phase relationship (as examples, 0 degrees or 90 degrees of phase offset) between the reference signal and the local clock, an additional fixed or variable phase adjustment is often introduced to permit the phase offset to be set to a different desired value (as one example, 45 degrees of phase offset) to facilitate receiver data detection.

Advanced receiver embodiments may require the generation of two or more local clocks having particular phase relationships. As one example, a so-called "four phase" embodiment incorporates four instances of detection apparatus configured to operate on consecutive unit intervals of the received signal, with the resulting parallelism providing extended detection time. In such a system, four phases of local clock signals may be required having a fixed frequency and phase relationship to the reference signal, and also having fixed relationships to each other.

PLL Overview

Phase Locked Loops are well represented in the literature. A typical PLL is composed of a phase detector that compares an external reference signal to an internal clock signal, a low pass filter that smooths the resulting error value to produce a clock control signal, and a variable frequency clock source (typically, a Voltage Controlled Oscillator or VCO) controlled by the smoothed error value, producing the internal clock signal presented to the phase detector.

In an alternative embodiment, the variable frequency clock source is replaced by a variable delay element, its (optionally multiple tapped) outputs thus representing one or more successive time-delayed versions of the original input signal rather than successive cycles of an oscillator to be phase compared to the reference input signal. For the purposes of this document, such Delay Locked Loops (DLL) are considered functionally equivalent to a PLL in such an application, and the tapped variable delay element of a DLL functionally equivalent to the ring of delay elements in a PLL ring-oscillator VCO.

In one embodiment, a ring oscillator composed of a sequence of identical gates in a closed loop is used as the internal Voltage Controlled Oscillator (VCO) timing source for the PLL. The VCO frequency is varied by analog adjustment of at least one of gate propagation delay, intergate rise and fall time, and gate switching threshold within the ring oscillator. As examples, the supply voltage or current provided to the ring oscillator elements may be adjusted to modify internal node switching time and thus the resulting oscillation frequency. Outputs taken at equal intervals (i.e. separated by equal numbers of ring oscillator gates) along the sequence of gates comprising the ring oscillator can provide multi-phase clocks having a fixed phase relationship. Such ring oscillators are well represented in the art, typically comprised of three to eight or more elements typically embodied as digital inverters, with both single-ended and differential signal variations described in the literature.

The example embodiment illustrated in FIG. 1 incorporates ring oscillator 110 to generate clock signals VCO Phase 1 and VCO Phase 2. In this example, 110 utilizes three differential delay elements (shown here as differential inverters) connected in a ring, with the two VCO clock outputs having a fixed 180 degree phase relationship with each other.

It is known that periodic variations in edge timing of a receiver's local clock signals can lead to degraded signal detection quality, thus it is extremely desirable to minimize these effects. In the example of FIG. 1, Clock Phase 1 and Clock Phase 2 are ideally perfect square waves of constant frequency, with exact 50% duty cycles and zero differential phase error or "skew." In practice, however, it is recognized that unavoidable variations among the ring oscillator elements can result in asymmetric output waveforms and periodic timing variations.

[Tajalli 1] describes a ring oscillator embodiment in which multiple ring oscillator output phases are compared against each other using a matrix phase detector. The resulting differential phase error information is used to incrementally adjust the delay of each ring oscillator element, above and beyond the overall frequency and phase error correction applied to the ring oscillator as a whole by the primary PLL phase detector.

One embodiment of the system shown in FIG. 1 includes a ring oscillator operating at frequencies near the practical limits of the integrated circuit process used. Thus, a minimal three-stage ring was designed, with an extremely tight physical layout to minimize parasitic node capacitance. In this design, the extra metallization lines needed to bring in individual delay controls for each stage, and the additional loading introduced by bringing out individual ring phases for matrix comparison, introduced unacceptable constraints on the desired maximum VCO operating frequency.

Instead of directly manipulating ring oscillator elements, the system of FIG. 1 processes selected clock outputs $Clk_1$ and $Clk_2$ selected via clock selection circuit 115 using configurable buffer chains 120 and 160, allowing each output clock Clock Phase 1 and Clock Phase 2 to be brought to the desired 50% duty cycle and zero differential phase before use by the receiver system. In some embodiments, the sources used to generate $Clk_1$ and $Clk_2$ may be selected via the clock selection circuit 115, shown in FIG. 1 as a differential multiplexer. Such a clock selection circuit may have inputs from the VCO 110 and inputs provided via a phase interpolator (PI) 117 that may be operating e.g., on outputs of the VCO. Thus, the duty cycle and delay correction circuit may be shared between the "main" clocks and the "PI" clocks. For descriptive simplicity, $Clk_1$ and $Clk_2$ are assumed to be full-swing CMOS clock signals with a 180-degree phase offset with no limitation implied.

Measurement subsystem 200 observes the resulting outputs Clock Phase 1 and Clock Phase 2, measuring individual clock duty cycles Clk1_duty and Clk2_duty respectively, and the differential clock offset between $Clk_1$ and $Clk_2$, denoted Clk_skew. In some embodiments, the delay correction Clk_skew may include a rising-edge to rising-edge (RE-to-RE) component and a falling-edge to falling-edge (FE-to-FE) component. The control logic 240 provides multi-bit control signals for adjusting stages 121, 122, and 123 in configurable clock buffer chains 120 and 160 to maintain the desired result at their outputs. FIG. 2B is a block diagram of an exemplary control logic 240, in accordance with some embodiments.

Figure 9:
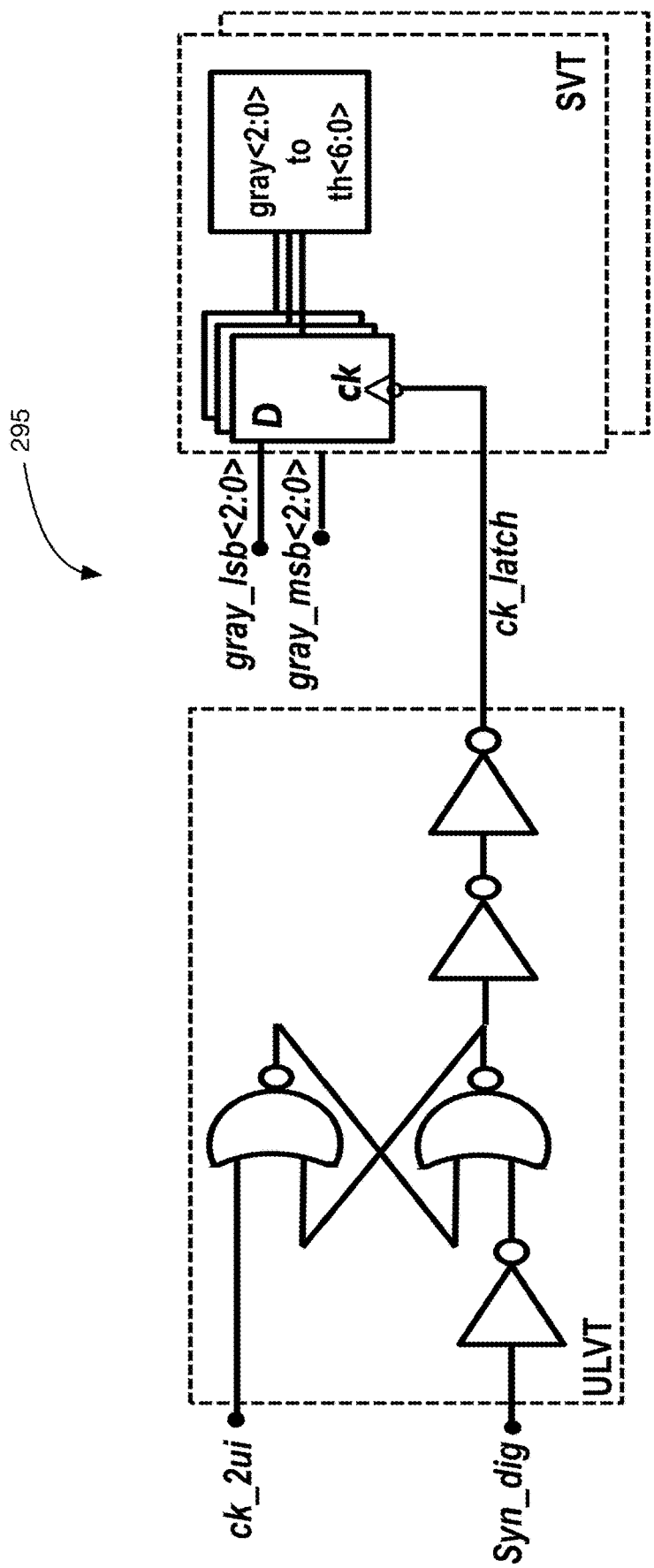
FIG. 9 is a block diagram of a control signal generator and synchronizer, in accordance with some embodiments.
Figure 10:
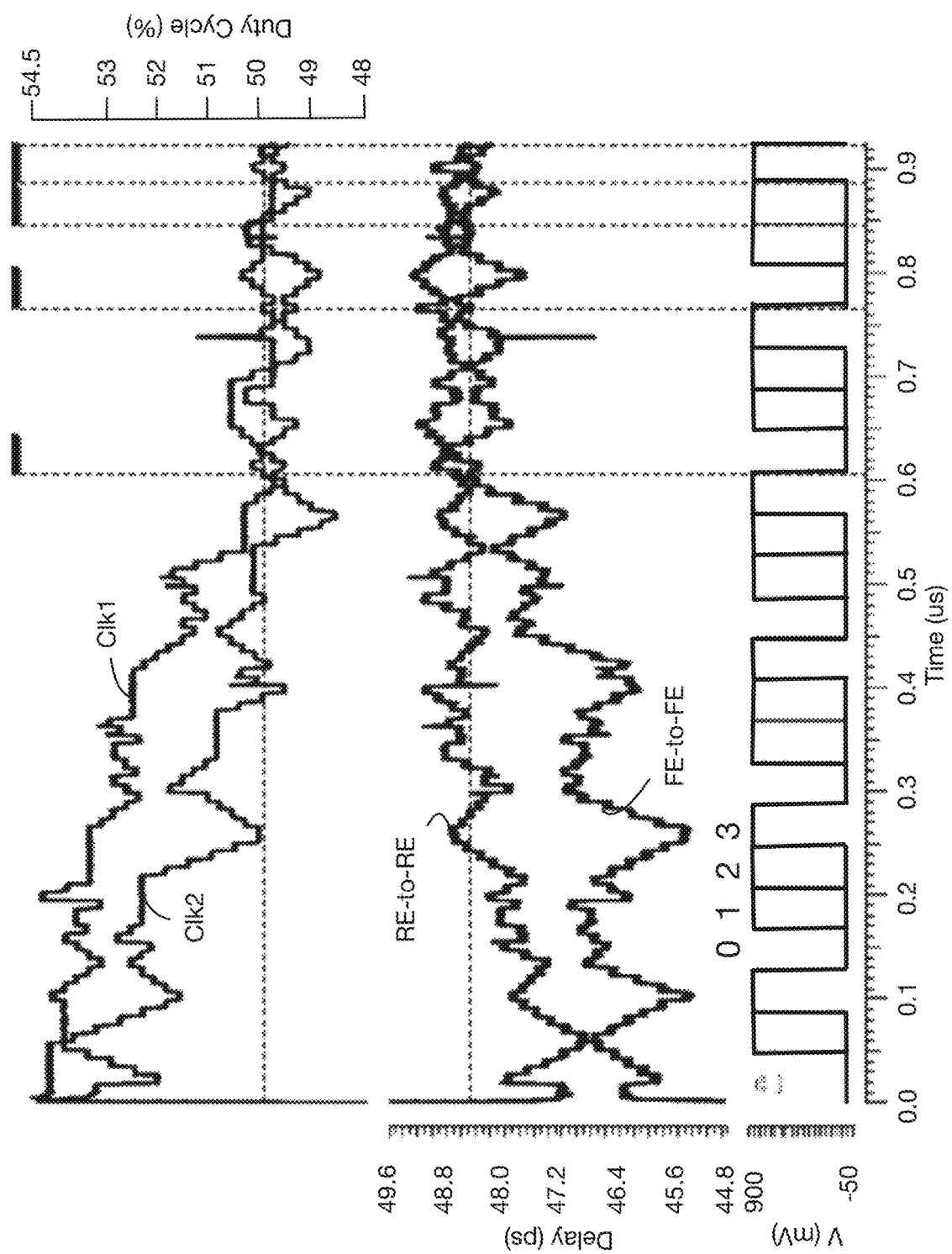
FIG. 10 is a waveform illustrating incremental corrections made over a 1 microsecond time period, in accordance with some embodiments.

As shown, control logic 240 includes a selection circuit 293, shown in FIG. 2B as a multiplexer. The multiplexer may be a differential multiplexer configured to receive differential inputs corresponding to (i) the duty cycle corrections for the first and second clock signals Clk1_duty and Clk2_duty, respectively, and delay corrections generated from the inter-phase comparison of the edge-triggered half-rate clocks, shown as FE-to-FE_delay and RE-to_RE_delay. The selection circuit 239 may be configured to incrementally select the inputs, and to provide the selected input to a shared low-pass filter. The filtered result may be provided to control signal generator 295, which generates the multi-bit control signals EnP<13:7>, EnN<13:7>, EnPb<6:0> and EnNb<6:0>. The control signal generator 295 may be configured to synchronize the multi-bit control signals according to a digital flag syn_dig and a two UI clock Clk_2ui. FIG. 9 is a block diagram of an exemplary control signal generator 295, in accordance with some embodiments. FIG. 10 illustrates waveforms of an incremental update process, in accordance with some embodiments.

Figure 2A:
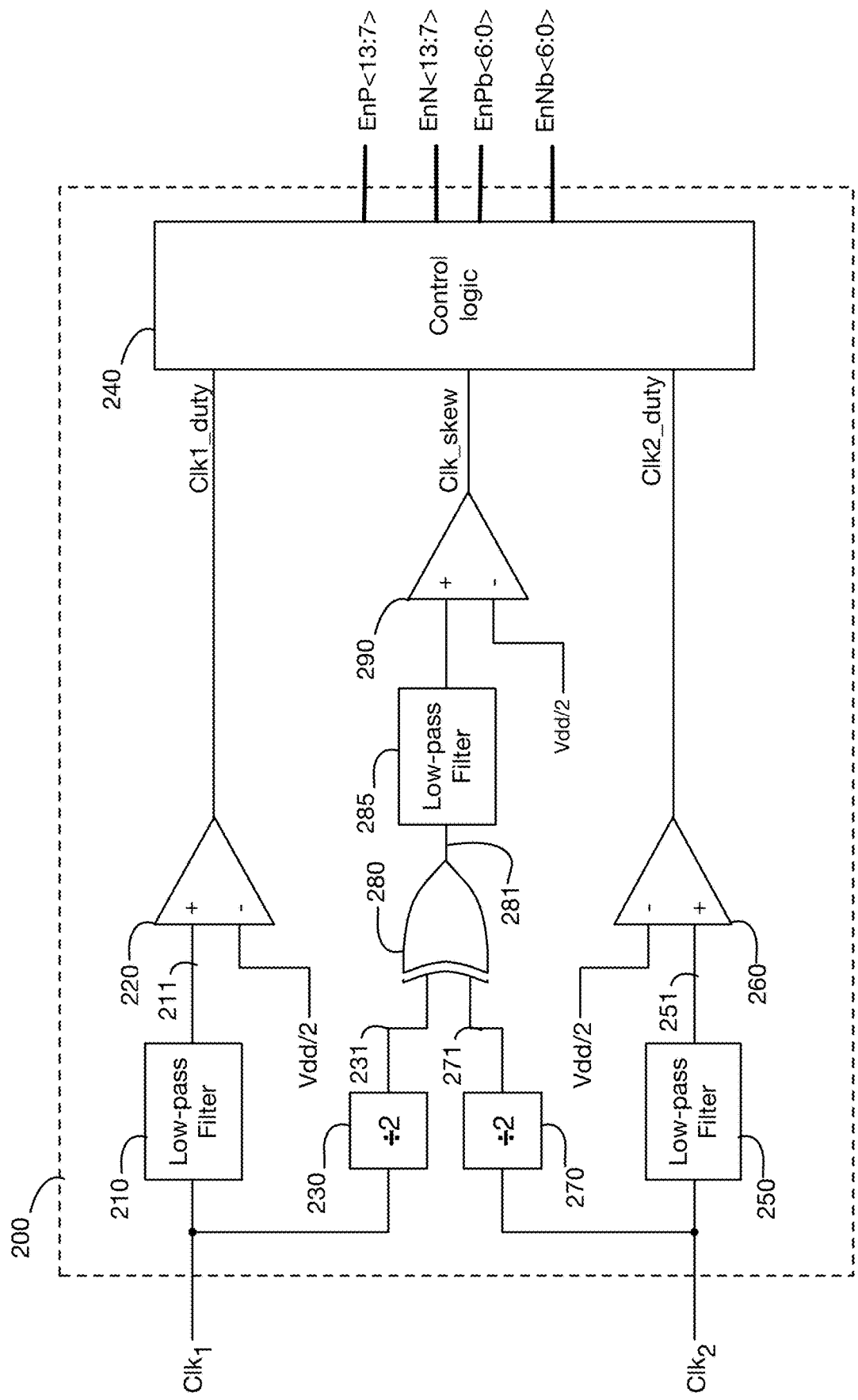
FIG. 2A is a block diagram of an embodiment measuring the duty cycle and phase relationship of two clock signals.
Figure 2B:
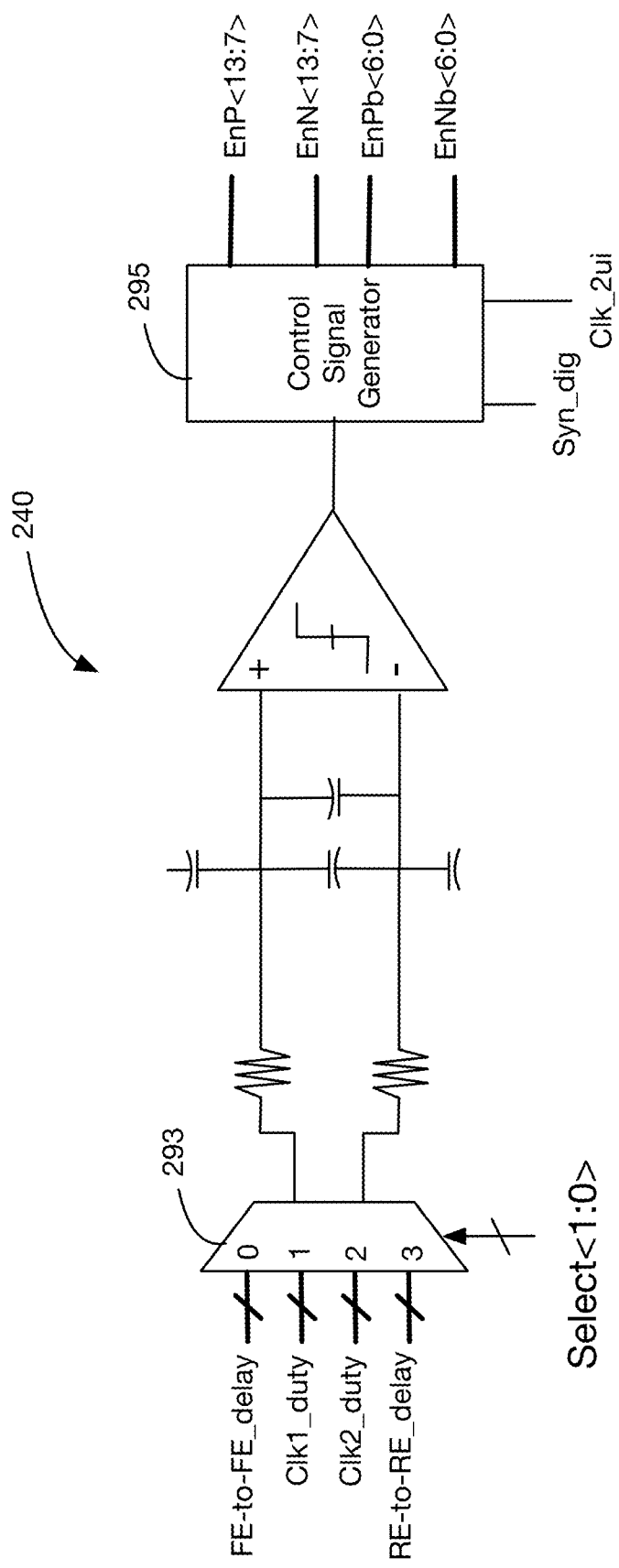
FIG. 2B is a block diagram of the control logic of FIG. 2A, in accordance with some embodiments.

FIG. 2A shows additional details of measurement system 200. If inputs $Clk_1$ and $Clk_2$ are full-swing 50% duty cycle CMOS signals, their time-averaged DC/common mode level will be Vdd/2, or one-half of the total signal excursion. For the first clock signal $Clk_1$, Low-pass filter 210 performs such a time-averaging operation, with analog result 211 representing the average DC level of the first clock signal. Comparator 220 compares 211 to a fixed DC reference of Vdd/2, with the duty cycle correction Clk1_duty indicating whether the duty cycle of the first clock signals $Clk_1$ is greater than, or less than the desired 50% value. Similarly, Low-pass Filter 250 generates the analog result 251 representing the average DC level of the second clock signal and Comparator 260 compares 251 to the reference voltage Vdd/2 to produce duty cycle correction Clk2_duty. A 50% duty cycle approach should not be considered limiting, and another appropriate fixed DC reference may be set for inputs having a different desired duty cycle or different voltage swing.

Figure 7:
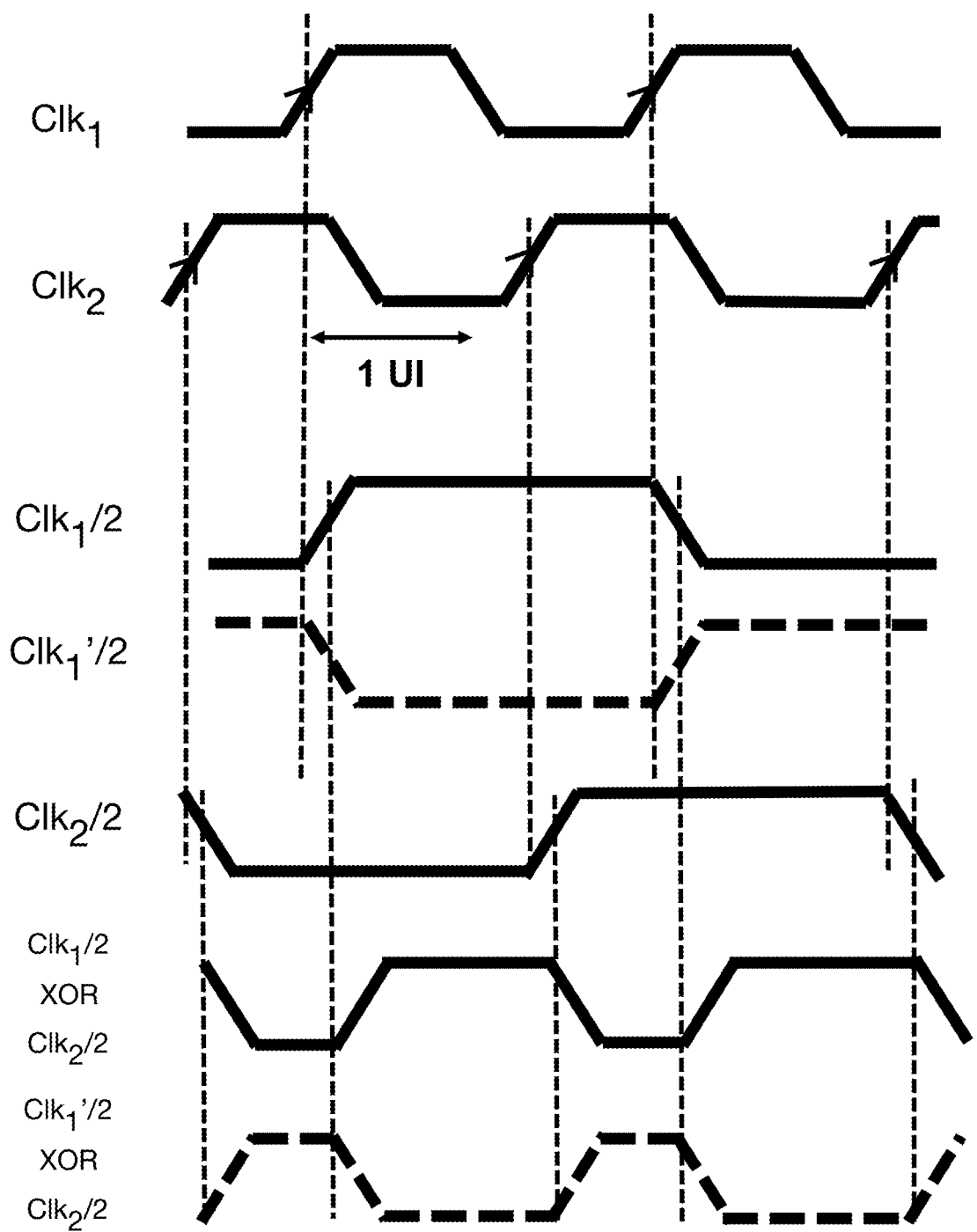
FIG. 7 illustrates waveforms of various signals generated in a rising-edge to rising-edge delay correction process, in accordance with some embodiments.

Digital divide-by-2 flip-flops 230 and 270 produce rising-edge (RE) and/or falling-edge (FE) triggered half-rate square wave signals 231 and 271 from rising/falling edges respectively of $Clk_1$ and $Clk_2$ which are then compared by phase detector 280, shown here as a simple XOR gate. In some embodiments, both RE and FE triggered half-rate clocks are generated, while alternative embodiments may utilize a single edge-triggered half-rate clock to reduce convergence time for duty cycle and clock skew. FIG. 7 illustrates various waveforms generated for duty cycle corrections between rising edges of $Clk_1$ and $Clk_2$, in accordance with some embodiments. As shown, $Clk_1$ and $Clk_2$ have a rising-edge to rising-edge delay that is greater and a single unit interval (UI). Edge-triggered half-rate clocks are generated for each of $Clk_1$ and $Clk_2$, shown as $Clk_1/2$ and $Clk_2/2$, respectively. An inter-phase comparison is formed by taking a logical XOR of the edge-triggered half-rate clocks. As shown in FIG. 7, the inter-phase comparison has a duty cycle>50%, indicative of the >1 UI delay between the rising edges in Clks 1 and 2. Such a delay correction may then be applied to elements controlling the rising edges of Clks 1 and 2, described in more detail below. As $Clk_1$ and $Clk_2$ in this example have a 180-degree phase differential, clocking the divide-by-2 flops with the same edge (e.g. rising clock edge) of both clocks will result in edge-triggered half-rate clock signals having a 90-degree phase differential, absent any skew in the original clock signals. Thus, delay correction 281 will ideally be a perfect square wave of 50% duty cycle with any skew between the input clocks presented as a duty cycle error in the delay correction which may be measured as previously described, using low-pass filter 285 and comparator 290 to produce delay correction Clk_skew. To ensure a valid result, dividers 230 and 270 may be initialized to a known state at startup (as one example, such that that first positive-going transition of 231 will precede the first positive-going transition of 271) to ensure the desired phase relationship between their outputs can be observed. FIG. 7 includes the resulting interphase comparison of $Clk_1'/2$ XOR'd with $Clk_2/2$ that may occur absent any start up initialization. As shown, the duty cycle of the resulting erroneous waveform is <50%. Again, no limitation is implied, as a different desired clock phase relationship may be targeted by appropriate initialization of the divider initial state, transitioning edge, and/or DC comparison value for the resulting low-pass-filtered result.

Figure 6:
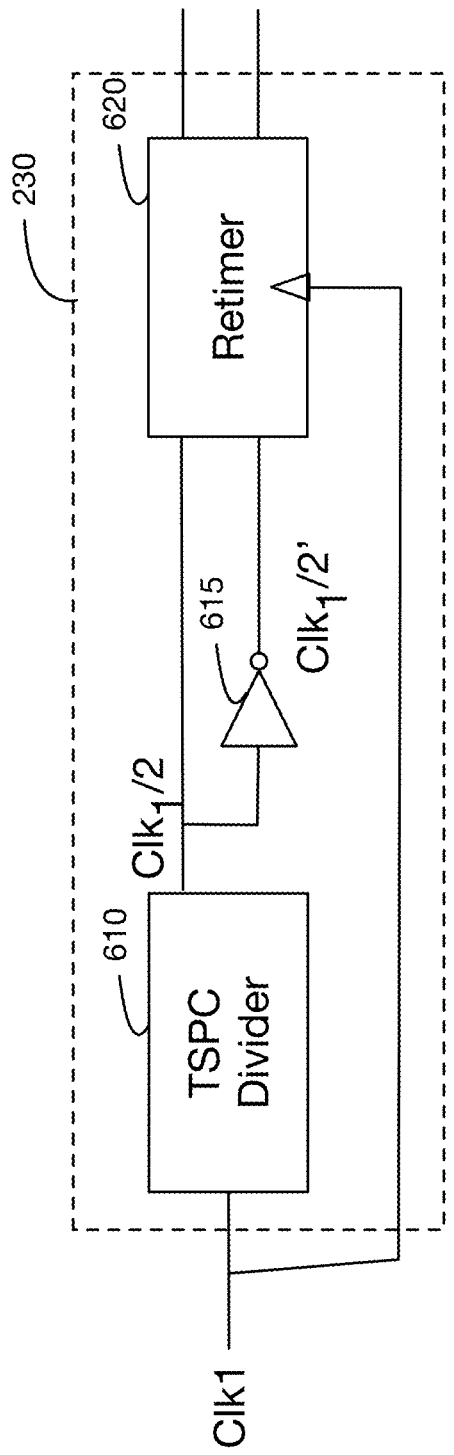
FIG. 6 is a block diagram of a single-ended to differential divider, in accordance with some embodiments.

One embodiment of 200 minimizes measurement errors by implementing all signals and signal processing elements differentially, with identical loading on both signal paths in each differential pair. Thus, as examples, differential signal $Clk_1$ passes through a differential R–C low pass filter 210 to differential comparator 220. FIG. 6 is a block diagram of one particular implementation of divider 230 operating on clock signal Clk1, in accordance with some embodiments. As shown, divider 230 includes a true single-phase clock (TSPC) divider 610 configured to generate singled-ended half-rate clock $Clk_1/2$ from single-ended clock signal Clk1. Divider 230 further includes an inverter 615 configured to generate an inverted version $Clk_1/2$ of the single-ended half-rate clock signal $Clk_1/2$. The two single-ended half-rate clocks $Clk_1/2$ and $Clk_1/2'$ may then be retimed using a retiming circuit 620 according to the input clock signal Clk1. Divider 270 operating on Clk2 may include similar elements. The differential edge-triggered half-rate clocks 231 and 271 are inter-phase compared by differential phase comparator 280 before being low-pass filtered 285 and compared 290. In at least one embodiment, the corner frequency of each low pass filter is set approximately 1000 times lower than the clock frequency to provide a desired amount of DC averaging. In a further embodiment, two-stage low pass filters are used, a first filter having a corner frequency 10 to 100 times lower than the clock frequency, with its result directed to a second filter providing the remainder of the desired amount of DC averaging. In some embodiments, the second filter and measurement comparator are shared among multiple first filters and measurement points using an analog multiplexor, eliminating the need for multiple instances of the substantial second filter capacitance.

Figure 3:
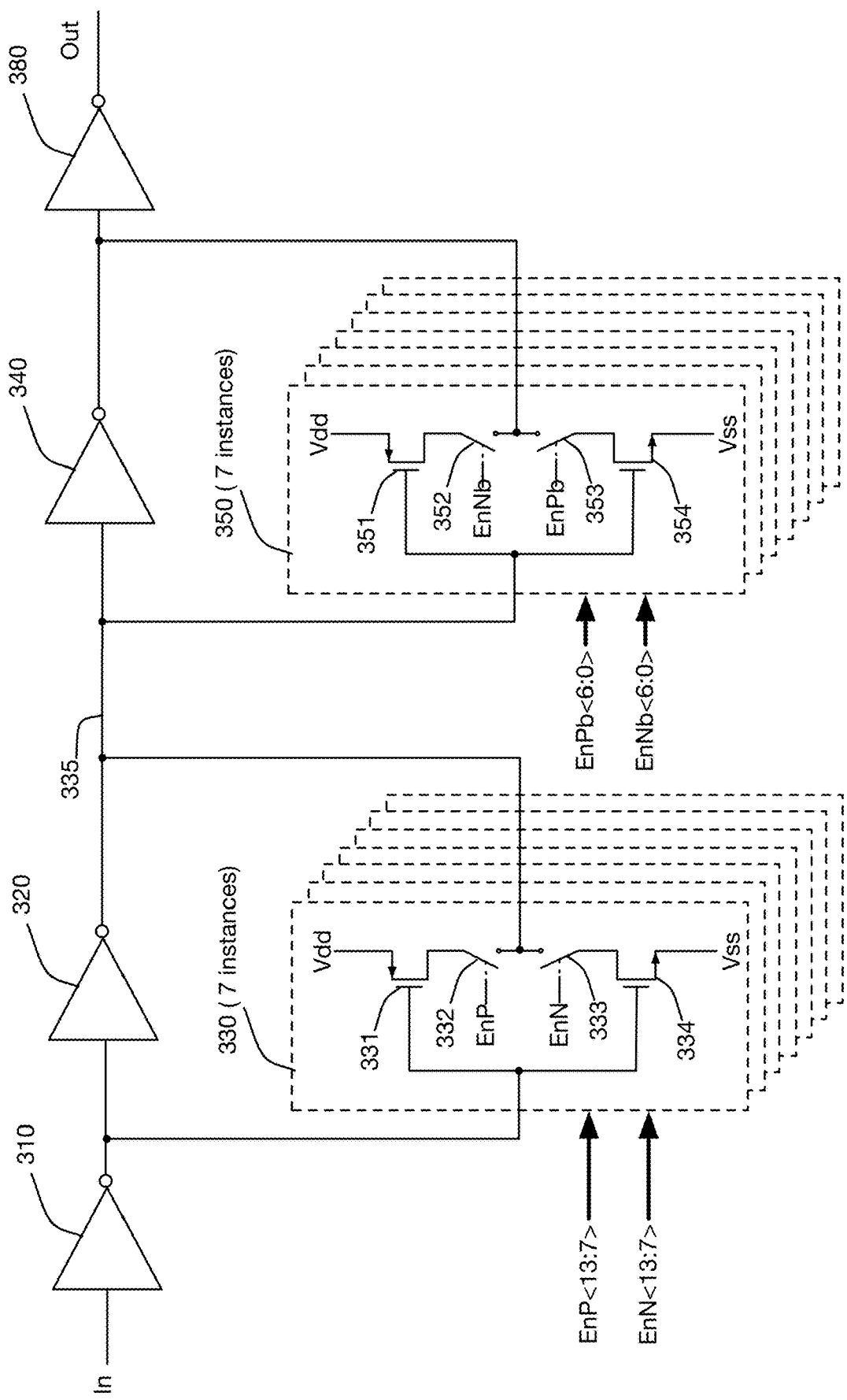
FIG. 3 is a schematic diagram of a clock buffer chain with configurable delay characteristics.

FIG. 3 details the internals of a configurable buffer chain, in accordance with some embodiments. In this embodiment, a series of digital inverters 310, 320, 340 amplify and buffer an input signal, resulting in an output suitable for driving a greater load and/or longer signal lines within an integrated circuit device. In some embodiments, the size of the transistors composing the inverter stages are scaled proportionately larger across the buffer chain, balancing increased drive capability with increased capacitive loading on the previous output stage. As one non-limiting example, the transistors within 320 may be twice the size and current-drive capability of those in 310, and those of 340 twice those of 320.

As illustrated in FIG. 3, the second stage of the buffer chain is composed of inverter 320, paralleled by seven instances of configurable augmentation inverter 330. As shown, each instance of 330 contains a pull-up transistor 331 and pull-down transistor 334 controlled by the same input signal as 320, and capable of driving the same output signal as 320. Enabling element 332, shown here as a switch, may be configured by control signal EnP to place pull-up transistor 331 into the active signal path, or to keep it isolated. In one representative embodiment, 332 and 333 are series MOS transistors. Similarly, control signal EnN controls enabling element 333, which may be configured to place pull-down transistor 334 into the active signal path, or keep it isolated. Enabling pull-up transistors 331 and pull-down transistors 334 may adjust the rising and falling edges of the eventual output signal Out of final output buffer stage 350. It should be noted that as there is a signal inversion at each stage of the illustrated buffer chain 310, 320, 330, the absolute clock edge associated with a "rising" and "falling" local signal edge will similarly reverse at each stage. For example, pull-up transistors 331 in stage 320 and pull-down transistors 354 in stage 340 may control the rising edge of the output signal Out (via enable signals EnP<13:7> and EnPb<6:0>, respectively) while pull-down transistors 334 in stage 320 and pull-up transistors 351 in stage 340 may control the falling edge of the output signal Out (via enable signals EnN<13:7> and EnNb<6:0>, respectively), or vice versa depending on the total number of buffer stages. Furthermore, pull-up transistors 331 and pull-down transistors 334 in stage 320 may include multiple transistors connected in parallel, increasing the effective size with respect to the transistors in stage 340.

Figure 4:
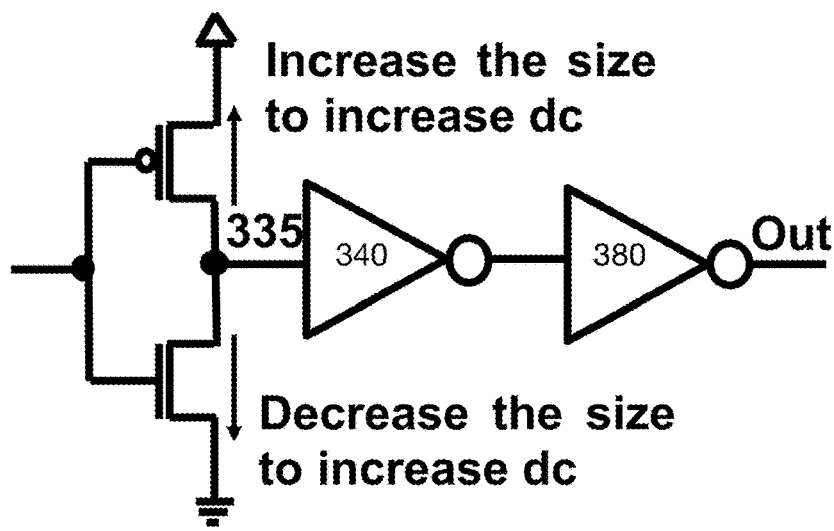
FIG. 4 illustrates a technique for adjusting a duty cycle of a clock signal and corresponding waveforms, in accordance with some embodiments.
Figure 4:
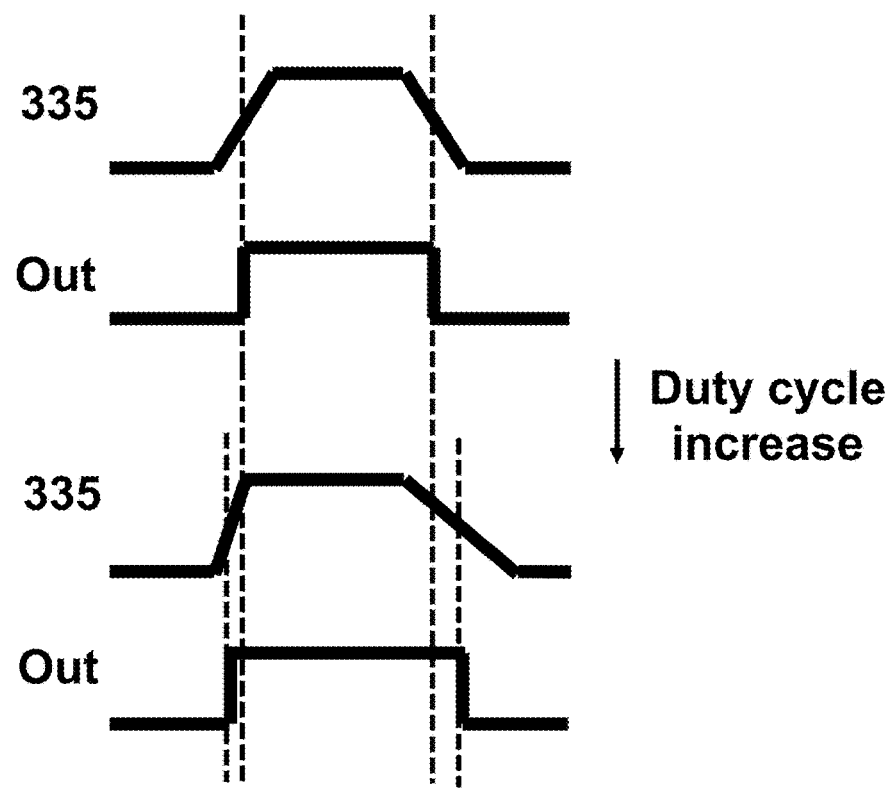
Figure 5:
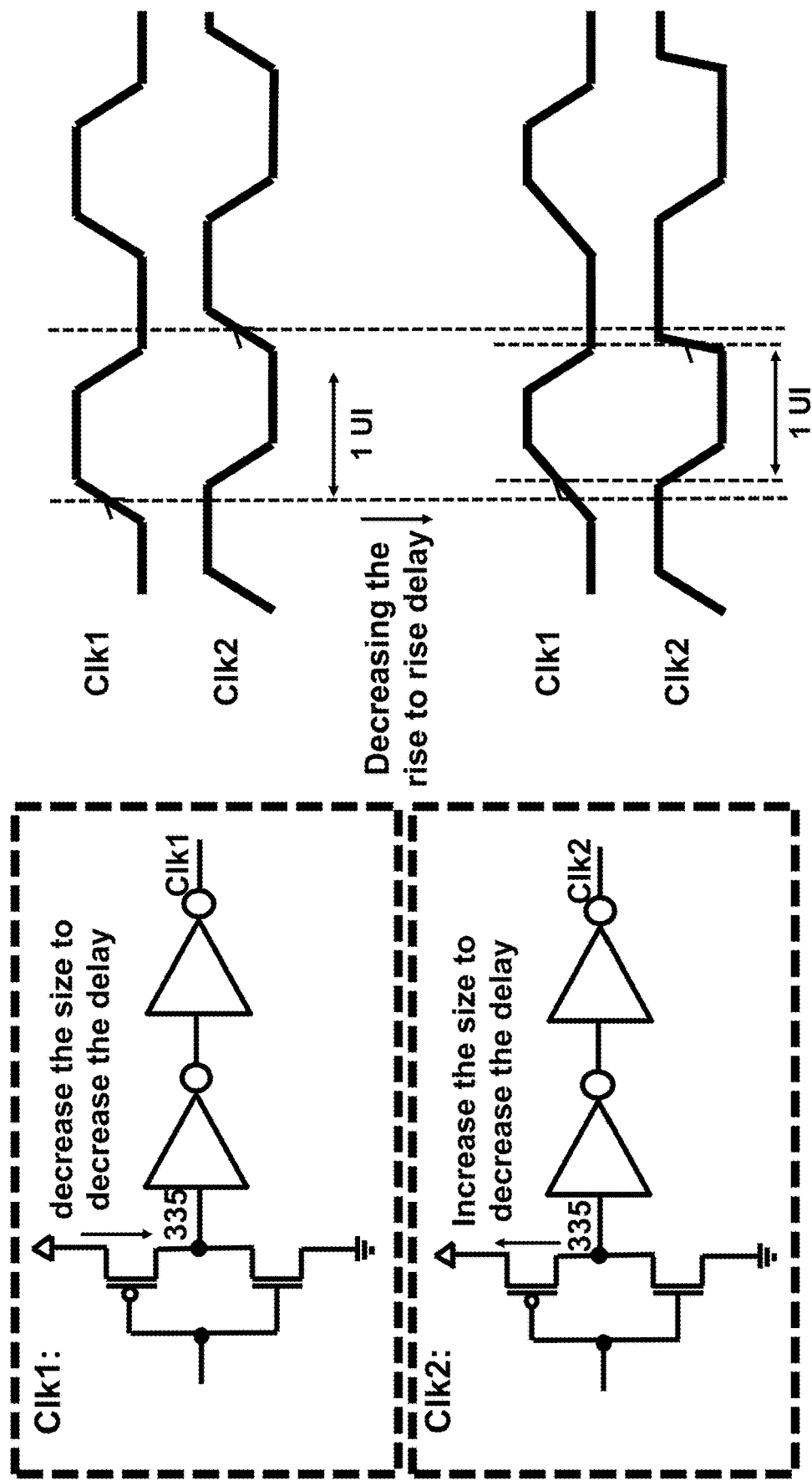
FIG. 5 illustrates a technique for adjusting rising-edge to rising-edge delays between two clock signals and corresponding waveforms, in accordance with some embodiments.

FIGS. 4 and 5 illustrate exemplary behavior of instances 330, in accordance with some embodiments. As transistors 331 are enabled via EnP and transistors 334 are disabled via EnN, the duty cycle of the output signal Out increases due to the decrease in rise time of the rising edge and the increase in fall time of the signal on node 335, as shown in FIG. 4. Similarly, disabling transistors 331 and enabling transistors 334 may decrease the duty cycle of the output signal Out. FIG. 5 illustrates a mechanism for correcting rising-edge to rising-edge delay between Clks 1 and 2. As shown, disabling transistors 331 in the buffer generating Clk1 and enabling transistors 331 in the buffer generating Clk2 increases the rise time for Clk1 and decreases the rise time for Clk2, respectively. Such adjustments may create a one-unit interval alignment between the rising edges of clock signals Clk1 and Clk2.

When both EnP and EnN are enabled in a given parallel stage 330, stage 330 acts in parallel with 320 to provide an increased output drive current for both rising and falling edges of signal transitions on node 335, thus incrementally reducing the effective overall propagation delay of 310. Enabling only EnP provides increased drive (and thus, a faster transition time,) only for rising transitions, and enabling only EnN provides increased drive (and thus, faster transition time,) only for falling transitions. Other characteristics remaining constant, a faster rising transition time will incrementally increase the duration of active high levels of signal 321, and a faster falling transition time will incrementally increase the duration of active low levels of signal 312.

Seven parallel instances of 330 are shown, thus if control signals EnP<13:7> and EnN<13:7> are thermometer-coded, seven distinct amounts of augmentation may be configured for each of the rising and falling edge rates seen at node 321. Similarly, the seven instances of 350 can be configured to augment 340, using control signals EnP<6:0> and EnN<6:0>.

In one embodiment, transistors 331 and 334 within 330 are twice the size and current drive capability of the comparable transistors 351 and 354 in stage 340. As the transistors in 320 are themselves scaled to be twice the size of those in 340, one may observe that each step of augmentation provided by 330 may be 4× (assuming a 2× increase per stage) that provide by 350, thus EnP<13:7> and EnN<13:7> may be considered as "coarse" adjustment controls, and EnPb<6:0> and EnNb<6:0> as "fine" adjustment controls over the rising and falling edge characteristics of the signals being buffered by their respective stages.

As the "fine" and "coarse" control signals are thermometer-encoded where they are applied to each augmentation group, incremental control signal changes within each group are glitch-free. One particular embodiment insures that concurrent changes to both fine and coarse control signals are synchronized, by latching all control signals using a common clock. A further embodiment changes the amount of augmentation for a given edge transition only when the drivers for that edge are inactive. FIG. 9 illustrates such a mechanism for ensuring glitch-free incremental changes utilizing a digital flag syn_dig to latch the outputs of most significant bits gray_msb<2:0> and least significant bits gray_lsb<2:0> prior to being converted to corresponding thermometer coded bits th<6:0>.

In one embodiment, a finite state machine within the measurement subsystem initiates duty cycle and skew measurements, interprets the results, and adjusts the configurable clock buffer chains to minimize duty cycle and skew errors. To reduce power utilization, the measurement subsystem may operate periodically, rather than continuously. The finite state machine may perform duty cycle corrections for clock 1, duty cycle corrections for clock 2 duty cycle, and delay corrections for rising-edge to rising-edge and/or falling-edge to falling-edge delay corrections sequentially. FIG. 10 illustrates various steps of such a sequential operation. As shown, control signals '0', '1', '2', and '3' may correspond to a two-bit input to a selection circuit, e.g., a multiplexor in control logic 240. In the embodiment of FIG. 10, a selection input of '0' corresponds to falling-edge to falling-edge (FE-to-FE) delay corrections between clocks Clk1 and Clk2, a selection input of '1' corresponds to duty cycle correction of Clk1, a selection input of '2' corresponds to a duty cycle correction of Clk2, and a selection input of '3' corresponds to rising-edge to rising-edge (RE-to-RE) delay corrections between clocks Clk1 and Clk2. As shown, the system corrects duty cycle and delays between Clk1 and Clk2 in approximately 1 microsecond.

In a first startup mode, the duty cycle of each clock is rapidly optimized by simultaneously modifying both the rise time and the fall time configuration of its respective buffer chain after each measurement cycle. The skew between the two clocks is adjusted by modifying both the first and second clock rise times after each measurement cycle.

In a second operational mode, the duty cycle of each clock is adjusted non-intrusively, by incrementing modifying only the falling edge characteristics of the clock buffers after each measurement cycle. If required, the skew between the two clocks is adjusted by incrementally modifying the rise time for one clock or the other.

To minimize the number of control signals needing to be routed, the measurement subsystem outputs binary control values. A gray code is used to minimize glitching when incrementally increasing or decreasing a control value. The more-significant and less-significant portions of the control value are locally converted using Boolean logic from gray code to thermometer code to control enabling of driver elements in 350 and 330, respectively. Clocked latches synchronize changes between more-significant and less-significant portions of the control value to minimize glitching.

Figure 8:
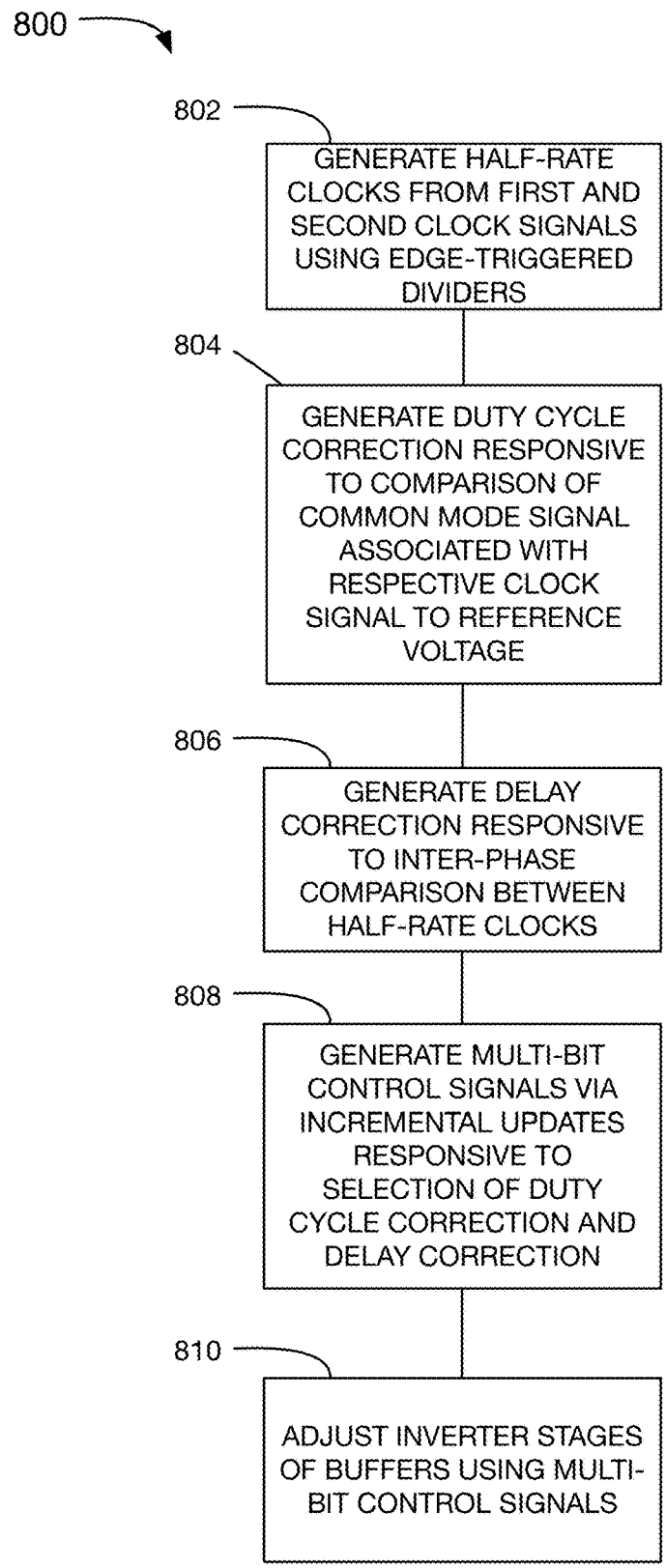
FIG. 8 is a flowchart of a method 800, in accordance with some embodiments.

FIG. 8 is a flow chart describing one embodiment of a method 800 in accordance with some embodiments. As shown, method 800 includes generating edge-triggered half-rate clocks from a divider operating responsive to edges of first and second clock signals. The method further includes generating 808 a set of multi-bit control signals, each multi-bit control signal having coarse and fine components for adjusting a rising edge and a falling edge of a respective clock signal of the first and second clock signals, each multi-bit control signal incrementally updated responsive to a selection of a duty cycle correction of the respective clock signal generated 804 responsive to a comparison of a common mode signal associated with the respective clock signal to a reference voltage and delay corrections between the first and second clock signals, the delay corrections generated 806 responsive to inter-phase comparisons between the edge-triggered half-rate clocks. The coarse and fine inverter stages of a set of clock buffers generating the first and second clock signals are adjusted 810 according to the coarse and fine components of the set of multi-bit control signals, respectively.

In some embodiments, generating the edge-triggered half-rate clocks includes generating half-rate singled-ended clocks from the first and second clock signals. In such embodiments, generating the half-rate clock signals includes generating complements of the half-rate single-ended clocks using inverters, and retiming the complements and the half-rate single-ended signals according to the corresponding first and second clock signals.

In some embodiments, the edge-triggered half-rate clocks include RE-triggered half-rate clocks and FE-triggered half-rate clocks from dividers operating responsive to rising edges and falling edges, respectively, of the first and second clock signals. In such embodiments, the method includes generating delay corrections between the first and second clock signals responsive to inter-phase comparisons between the RE-triggered and FE-triggered half-rate clocks. In some embodiments, generating the edge-triggered half-rate clocks includes enabling the dividers in a predetermined order. Such a predetermined order may be implemented via a state machine or logic.

In some embodiments, the method further comprising includes synchronizing the coarse and fine components of the multi-bit control signal. In some such embodiments, synchronization includes incrementally updating the set of multi-bit control signals by latching the coarse and fine components of the multi-bit control signal according to a flag signal. In some embodiments, the set of multi-bit control signals correspond to thermometer bits. In some such embodiments, the method further includes generating the thermometer bits from a gray code.

In some embodiments, the duty cycle corrections and delay corrections are selected via a selection circuit to incrementally update the multi-bit control signals. In some embodiments, the method further includes low-pass filtering each duty cycle correction and each delay correction responsive to selection by the selection circuit. The selection circuit may include a shared low-pass filter to perform the low-pass filtering.

In some embodiments, the method includes generating the common mode signal associated with the respective clock signal by low-pass filtering the respective clock signal.

In some embodiments, generating the inter-phase comparisons includes exclusively-OR (XORing) the edge-triggered half rate clocks. In some such embodiments, the method further includes low-pass filtering the inter-phase comparisons between the edge-triggered half-rate clocks. Such low-pass filters may be local low-pass filters operating directly on the outputs of the XOR logic gate.

In some embodiments, the coarse inverter stage precedes the fine inverter stage in the sets of clock buffers. In some embodiments, each bit of the coarse component of a given set of multi-bit control signal is provided to multiple inverters connected in parallel in the coarse inverter stage. In some embodiments, each inverter stage of a given set of clock buffers comprises at least one transistor for controlling the rising edge of a given clock signal and at least one transistor for controlling the falling edge of the given clock signal. In some embodiments, at least one transistor for controlling the rising edge of the given clock signal and at least one transistor for controlling the falling edge of the given clock signal are inverted with respect to each other in the coarse and fine inverter stages.

In some embodiments, adjusting the respective coarse and fine inverter stages of the set of clock buffers includes simultaneously adjusting the rising edges and falling edges of the first and second reference signals responsive to corresponding duty cycle corrections during a start-up mode of operation.

In some embodiments, adjusting the respective coarse and fine inverter stages of the set of clock buffers includes adjusting the falling edges of the first and second reference signals responsive to corresponding duty cycle corrections during a mission mode of operation. Furthermore, adjusting the respective coarse and fine inverter stages of the set of clock buffers may include simultaneously adjusting the rising or falling edges of the first and second reference signals responsive to each delay correction during a mission mode of operation, depending on which edge was used to generate the edge-triggered half-rate clocks.

In some embodiments, comprising selecting the first and second clock signals from a main clock path or a phase-interpolator clock path.

We claim:
1. An apparatus comprising:
a set of clock buffers configured to generate first and second clock signals, each clock buffer of the set of clock buffers comprising coarse and fine inverter stages for adjusting a rising edge (RE) and a falling edge (FE) of a respective clock signal of the first and second clock signals responsive to respective multi-bit control signals having coarse and fine components;

a frequency divider circuit configured to generate edge-triggered half-rate clocks responsive to rising or falling edges of the first and second clock signals;

a delay and duty cycle detection (DDCD) circuit configured to receive the first and second clock signals and the edge triggered half-rate clocks, the DDCD circuit configured to generate (i) duty cycle corrections of the respective clock signal responsive to a comparison of a common mode signal associated with the respective clock signal to a reference voltage, and (ii) delay corrections between the first and second clock signals, the delay corrections generated responsive to inter-phase comparisons between the edge-triggered half-rate clocks;

a control signal generator configured to generate the coarse and fine components of the respective multi-bit control signals based on the duty cycle corrections and the delay corrections, and to provide the coarse and fine components respective multi-bit control signals to the set of clock buffers;

a selection circuit configured to receive the duty cycle corrections and the delay corrections from the DDCD circuit and to incrementally output (i) the duty cycle correction for the first clock signal, (ii) the duty cycle correction for the second clock signal, and (iii) the delay corrections between the first and second clock signals to the control signal generator.

2. The apparatus of claim 1, wherein the control signal generator is configured to generate the respective multi-bit control signals to:
adjust both RE and FE times of the first and second clock signals during a startup mode; and
adjust one of the RE and FE times of the first and second clock signals to correct duty cycle during an operational mode, and to adjust another of the RE and FE times of the first and second clock signals during the operational mode to correct delay between the first and second clock signals.

3. The apparatus of claim 1, wherein the selection circuit comprises a shared low-pass filter.

4. The apparatus of claim 1, wherein the control signal generator performs glitch-free incremental changes to the multi-bit control signals.

5. The apparatus of claim 4, wherein the control signal generator is configured to generate gray coded versions of the coarse and fine components of the set of multi-bit control signals.

6. The apparatus of claim 5, wherein the control signal generator is configured to generate the coarse and fine components of the multi-bit control signal by converting the gray coded versions of the coarse and fine components of the multi-bit control signals to thermometer code.

7. The apparatus of claim 6, wherein the gray coded versions of the coarse and fine components of the multi-bit control signals are synchronized prior to being converted to thermometer code.

8. The apparatus of claim 7, wherein the control signal generator comprises latches configured to latch the coarse and fine components of the set of multi-bit control signals according to flag signal.

9. The apparatus of claim 1, wherein the delay corrections between the first and second clock signals are generated using edge-triggered half-rate clocks generated responsive to one of (i) the RE and (ii) the FE of the first and second clock signals.

10. The apparatus of claim 1, wherein the dividers comprise:
true single-phase clock (TSPC) dividers configured to generate half-rate singled-ended clocks from the first and second clock signals;
inverters configured to generate complements of the half-rate single-ended clocks; and
a retiming circuit configured to retime the complements and the half-rate single-ended signals according to the corresponding first and second clock signals.

11. A method comprising:
generating first and second clock signals using a set of clock buffers, each clock buffer of the set of clock buffers comprising coarse and fine inverter stages for adjusting a rising edge (RE) and a falling edge (FE) of a respective clock signal of the first and second clock signals responsive to respective multi-bit control signals having coarse and fine components;
generating edge-triggered half-rate clocks from a divider operating responsive to edges of first and second clock signals;
generating duty cycle corrections for each of the first and second clock signals using a delay and duty cycle detection (DDCD) circuit responsive to a comparison of a common mode signal associated with the respective clock signal to a reference voltage;
generating delay corrections between the first and second clock signals using the DDCD circuit, the delay corrections generated responsive to inter-phase comparisons between the edge-triggered half-rate clocks;
generating, using a control signal generator, the coarse and fine components of the set of multi-bit control signals based on the duty cycle corrections and the delay corrections; and
incrementally outputting, via a selection circuit, (i) the duty cycle correction for the first clock signal, (ii) the duty cycle correction for the second clock signal, and (iii) the delay corrections between the first and second clock signals to the control signal generator.

12. The method of claim 11, wherein during a startup mode, RE and FE times of the first and second clock signals are adjusted; and
wherein during an operation mode, one of the RE and FE times of the first and second clock signals are adjusted to correct duty cycle, and another of the RE and FE times of the first and second clock signal are adjusted to correct delay between the first and second clock signals.

13. The method of claim 11, wherein the selection circuit incrementally outputs (i) the duty cycle correction for the first clock signal, (ii) the duty cycle correction for the second clock signal, and (iii) the delay corrections between the first and second clock signals to a shared low pass filter connected to an input of the control signal generator.

14. The method of claim 11, wherein the set of multi-bit control signals are updated via glitch-free incremental changes.

15. The method of claim 14, wherein the glitch-free incremental changes comprise generating gray coded versions of the coarse and fine components of the set of multi-bit control signals.

16. The method of claim 15, wherein the glitch-free incremental changes further comprise converting the gray coded versions of the coarse and fine components of the multi-bit control signals to thermometer code.

17. The method of claim 16, wherein the gray coded versions of the coarse and fine components of the set of multi-bit control signals are synchronized prior to being converted to thermometer code.

18. The method of claim 17, wherein gray coded versions of the coarse and fine components of the set of multi-bit control signals are latched according to flag signal.

19. The method of claim 11, wherein the delay corrections between the first and second clock signals are generated using edge-triggered half-rate clocks generated responsive to one of (i) the RE and (ii) the FE of the first and second clock signals.

20. The method of claim 11, wherein generating the edge-triggered half-ratee clocks comprises:
   generating half-rate singled-ended clocks from the first and second clock signals;
   generating complements of the half-rate single-ended clocks using inverters; and
   retiming the complements and the half-rate single-ended signals according to the corresponding first and second clock signals.

\* \* \* \* \*